United States Patent
Simonin

(10) Patent No.: US 10,094,856 B2
(45) Date of Patent: Oct. 9, 2018

(54) MAGNETIC FIELD SENSOR ARRANGEMENT AND CURRENT TRANSDUCER THEREWITH

(71) Applicant: LEM INTELLECTUAL PROPERTY SA, Fribourg (CH)

(72) Inventor: Ludovic Simonin, Vesancy (FR)

(73) Assignee: LEM INTELLECTUAL PROPERTY SA, Fribourg (CH)

( * ) Notice: Subject to any disclaimer, the term of this patent is extended or adjusted under 35 U.S.C. 154(b) by 5 days.

(21) Appl. No.: 15/125,622

(22) PCT Filed: Mar. 17, 2015

(86) PCT No.: PCT/EP2015/055487
§ 371 (c)(1),
(2) Date: Sep. 13, 2016

(87) PCT Pub. No.: WO2015/140129
PCT Pub. Date: Sep. 24, 2015

(65) Prior Publication Data
US 2017/0003325 A1 Jan. 5, 2017

(30) Foreign Application Priority Data
Mar. 21, 2014 (EP) .................................... 14161200

(51) Int. Cl.
*G01R 15/20* (2006.01)
*G01R 19/00* (2006.01)

(52) U.S. Cl.
CPC ........... *G01R 15/202* (2013.01); *G01R 15/20* (2013.01); *G01R 19/0092* (2013.01)

(58) Field of Classification Search
CPC .............................. G01R 15/20; G01R 15/202
See application file for complete search history.

(56) References Cited

U.S. PATENT DOCUMENTS 4,972,140 A * 11/1990 Okazaki ............... G01R 15/202
324/117 H
6,686,730 B2 * 2/2004 Marasch .............. G01R 15/202
324/117 H
(Continued)

FOREIGN PATENT DOCUMENTS

| JP | 2005024519 | 1/2005 |
| JP | 2011007596 | 1/2011 |
| WO | WO 2009/151011 | 12/2009 |

OTHER PUBLICATIONS

International Search Report issued by the European Patent Office, dated Apr. 4, 2015, for International Application No. PCT/EP2015/055487; 4 pages.

(Continued)

*Primary Examiner* — Walter L Lindsay, Jr.
*Assistant Examiner* — Milton Gonzalez
(74) *Attorney, Agent, or Firm* — Faegre Baker Daniels LLP

(57) ABSTRACT

Magnetic field sensor arrangement for positioning in a gap formed between end faces (12) of a magnetic core (4), comprising a magnetic field detector (5), a housing (10), and a grounding device (8), the magnetic field sensor and grounding device being mounted to the housing. The grounding device comprises at least one contact (20) elastically supported and configured for electrical contact with the magnetic core. The elastically supported contact is mounted adjacent a sensing portion of the magnetic field sensor and configured for insertion in the magnetic circuit core gap such that the contact elastically biases against the end face of the magnetic core.

23 Claims, 6 Drawing Sheets

(56) References Cited

U.S. PATENT DOCUMENTS 6,759,840 B2 * 7/2004 Marasch .............. G01R 15/247
                                                    324/117 H
2010/0259248 A1   10/2010 Labbe

OTHER PUBLICATIONS

International Written Opinion issued by the European Patent Office, dated Apr. 4, 2015 for International Application No. PCT/EP2015/055487; 13 pages.

* cited by examiner

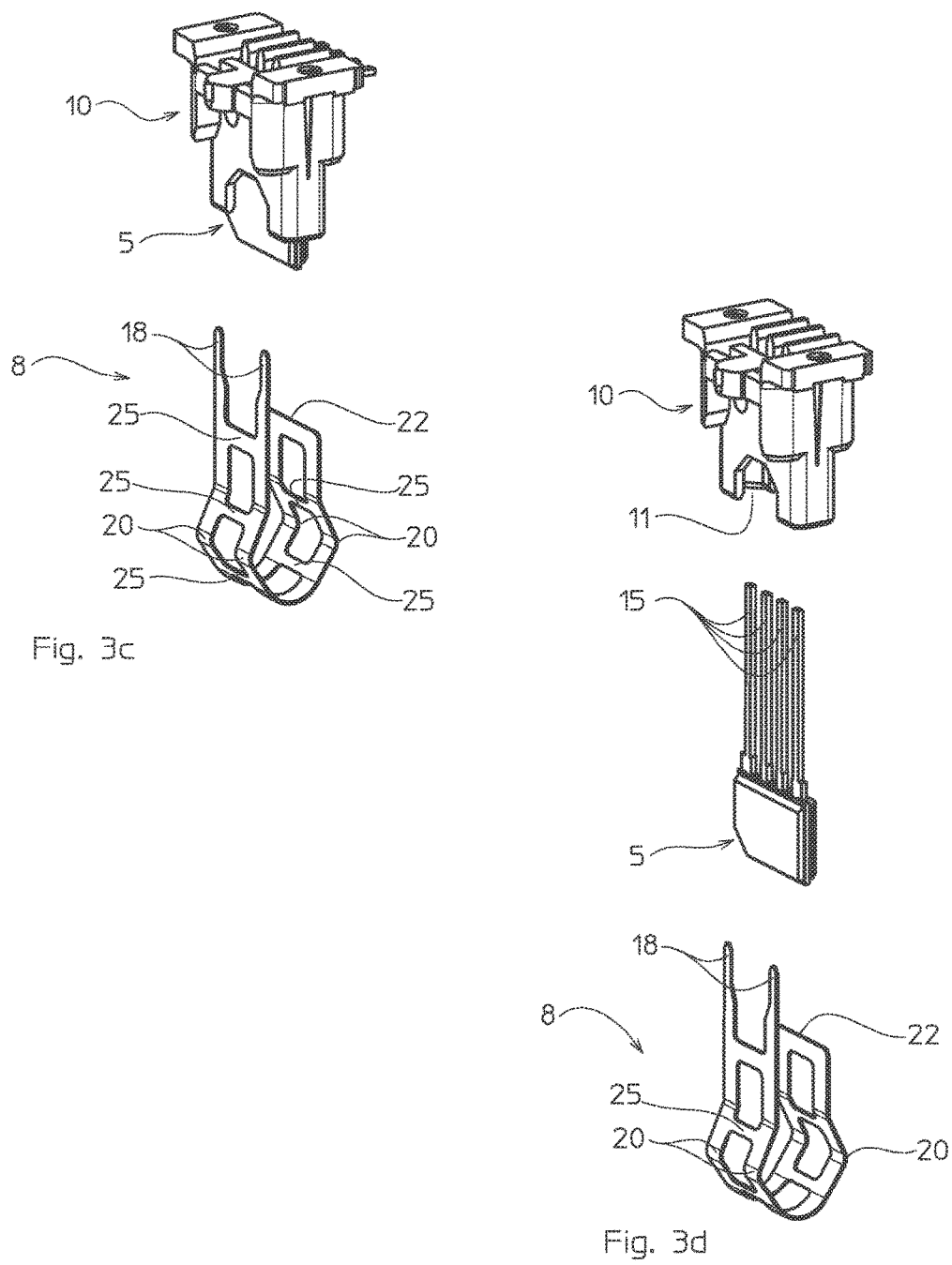

MAGNETIC FIELD SENSOR ARRANGEMENT AND CURRENT TRANSDUCER THEREWITH

This application claims priority to PCT application number PCT/EP2015/055487 filed Mar. 17, 2015, which in turn claims priority from EP Patent application number EP 14161200.2 filed Mar. 21, 2014, the subject matter of which are incorporated herein by reference.

The present invention relates to a magnetic field sensor arrangement for positioning in a gap of a magnetic circuit, in particular of an electrical current transducer, the magnetic field sensor arrangement comprising means for grounding the magnetic circuit.

Many conventional current transducers comprise a magnetic core made of material with a high magnetic permeability and a magnetic field sensor, such as a Hall effect sensor, positioned in a gap formed in the magnetic core. A primary conductor extending through a central passage of the magnetic circuit generates a magnetic field that is picked-up by the magnetic core. The magnetic field flows across the gap and the magnetic field detector positioned therein.

To avoid electrical discharge and ensure an accurate measurement of the current flowing in the primary conductor, the magnetic core is often connected to ground. Typically this is done by soldering, welding or crimping an electrical conductor, which is configured to be connected to ground, to the magnetic core. Working of materials with high magnetic permeabilities however can affect their magnetic properties, in particular by reducing their magnetic permeability and thus adversely affecting the magnetic performance of the magnetic circuit.

US 2010/259248 discloses an electrical current sensor comprising a magnetic core with an air gap, a magnetic field detector positioned in the air gap and a conductive mounting element. A bridge portion interconnects fixing extensions and spans across the air gap. The bridge portion comprises an electrical terminal in electrical contact with a grounding pad of the magnetic field detector.

WO 2009/151011 discloses a current sensor provided with an annular core wherein a gap is formed, an electromagnetic sensor arranged in the gap and a grounded shield means which electrostatically shields the electromagnetic sensor.

JP 2011 007596 discloses a current sensor core with an air gap, a circuit board and a Hall element positioned in the air gap. The current sensor comprises a ground member provided with bended pressing plates which presses against the Hall element.

It is an object of this invention to provide a magnetic field sensor and grounding device for a magnetic circuit of an electrical current transducer that is economical to implement in large series manufacturing and is compact and provides effective ground connection.

It is also an object of this invention to provide an electrical current transducer having a magnetic circuit with a gap, a magnetic field sensor and a grounding device, that is robust and economical to manufacture, especially in large series manufacturing.

It would be advantageous to provide an electrical current transducer that is compact and easy to assemble.

It would be advantageous to provide an electrical current transducer having a magnetic core that has uniform magnetic material properties, in particular a high and uniform magnetic permeability.

Objects of this invention have been achieved by providing a magnetic field sensor arrangement according to claim 1 for positioning in a gap of a magnetic circuit, in particular of an electrical current transducer.

Objects of this invention have been achieved by providing an electrical current transducer according to claim 12.

Disclosed herein is a magnetic field sensor arrangement comprising a magnetic field detector for positioning in a gap formed between end faces of a magnetic circuit core, a housing, and a grounding device. The magnetic field sensor and grounding device are mounted to the housing, the grounding device comprising at least one contact elastically supported and configured for electrical contact with the magnetic core. The elastically supported contact is mounted adjacent a sensing portion of the magnetic field sensor and configured for insertion in the magnetic circuit core gap such that the contact elastically biases against said end face of the magnetic core. The magnetic field sensor arrangement further comprises a circuit board to which the magnetic field detector, housing and grounding device are mounted and connected. A mounting base of the housing comprises a flange configured to enable the housing to be inserted through an orifice in the circuit board or other form of support, and to rest by way of the flange against a connection face of the circuit board on an opposite side from a face of the circuit board facing the magnetic core.

The magnetic field detector comprises terminals that may advantageously be positioned in sensor terminal guide slots formed in the mounting base of the housing. In an embodiment, the terminals are configured for surface mount connection to contact pads on a face of the circuit board The housing, which advantageously serves to position and hold together the magnetic field detector and grounding device and to mount these two parts to a circuit board, may comprise a sensor receiving cavity in which the magnetic field detector is inserted and lodged.

In an advantageous embodiment, the housing comprises a grounding terminal guide slot and a grounding free end guide slot disposed on respective outer side faces of the housing configured for holding or positioning the grounding device around the housing.

In an advantageous embodiment, the grounding device comprises a generally U-shaped band or strip of conductive material positioned around the magnetic field detector. The contacts may advantageously be provided on opposed sides of the housing for electrical contact with respective opposed end faces of the core.

In an advantageous embodiment, the contacts are formed as outwardly bent portions integrally formed with a strip of conductive material comprising one or more terminals for connection to a grounding conductor, the strip bending in a general U-shape around the end of the magnetic field sensor and having portions mounted against the outer sides faces of the housing.

In an advantageous embodiment, the a free end of the grounding element is received in a guide channel or slot on one side face and the terminals are received in guide channels or slots on the other side face of the housing.

In an advantageous embodiment, the grounding device comprises orifices such that the contacts are formed on spaced-apart branches connected by bridging portions.

In an advantageous embodiment, the grounding device may be a single integral part stamped and formed from sheet metal.

Also disclosed herein is an electrical current transducer comprising a magnetic core with an airgap and a magnetic field sensor arrangement as set forth above. The magnetic core may form a circuit surrounding a central cavity for receiving a primary conductor carrying a current to be measured therethrough. A portion of primary conductor may be integrated in the current transducer and comprise terminals for connection to a primary conductor, or the current transducer may comprise a central passage to allow insertion of a primary conductor therethrough. The current transducer may for instance be an open-loop type of current transducer.

Further objects and advantageous features of the invention will be apparent from the claims and the following detailed description of an embodiment in conjunction with the annexed figures in which:

FIG. 3c is a view of the device of FIG. 3a where the grounding device is disassembled from the housing;

FIG. 3d is an exploded view of the device of FIG. 3a;

Figure 1A:
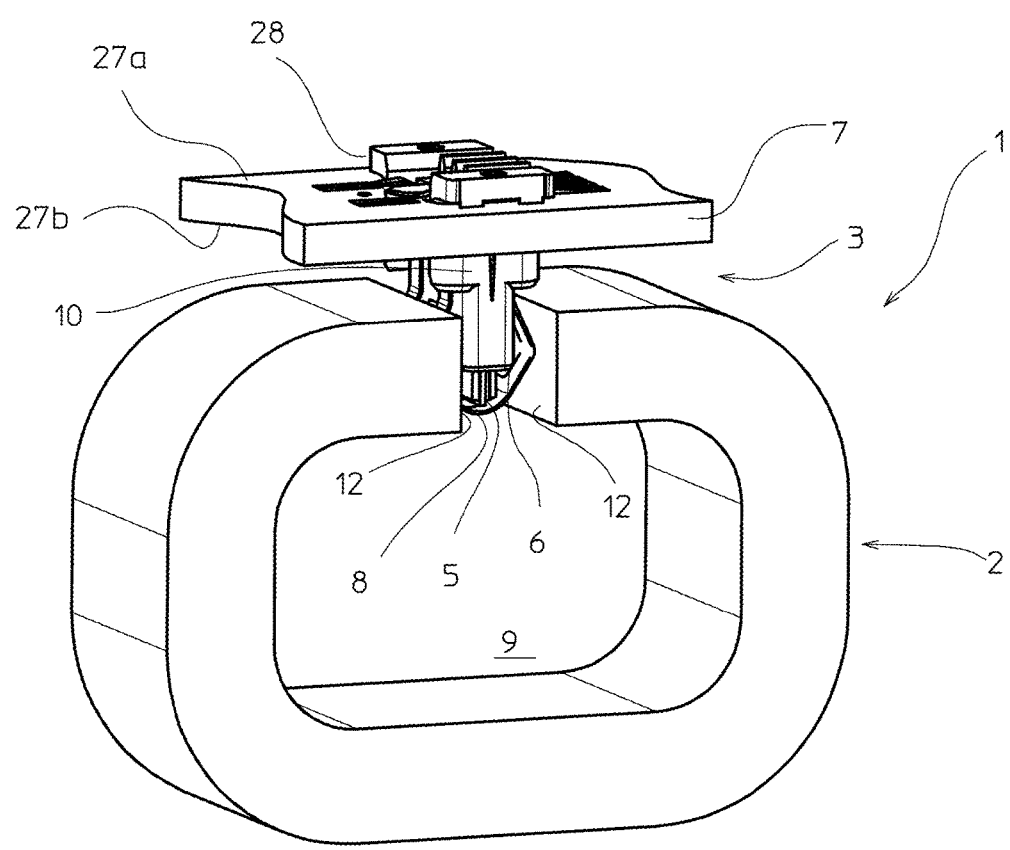
FIG. 1a is a view in perspective view of an electrical current transducer according to an embodiment of the invention, with a housing and portions of a circuit board removed.
Figure 1B:
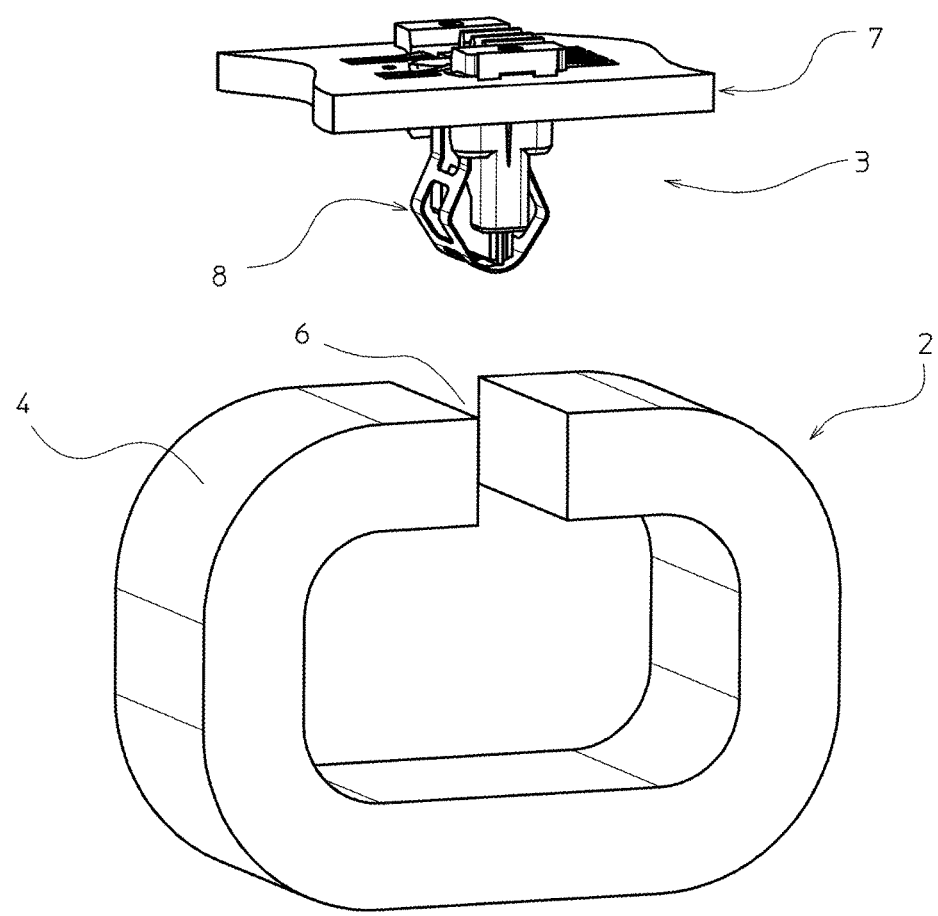
FIG. 1b is a view of the device of FIG. 1a where a magnetic field sensor arrangement is disassembled from a magnetic core.
Figure 2A:
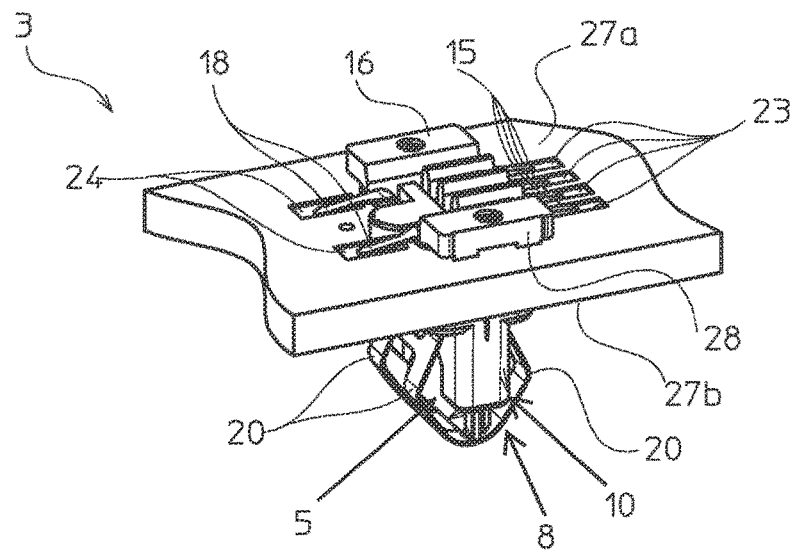
FIG. 2a is a view in perspective of the magnetic field sensor arrangement of FIG. 1b.
Figure 2B:
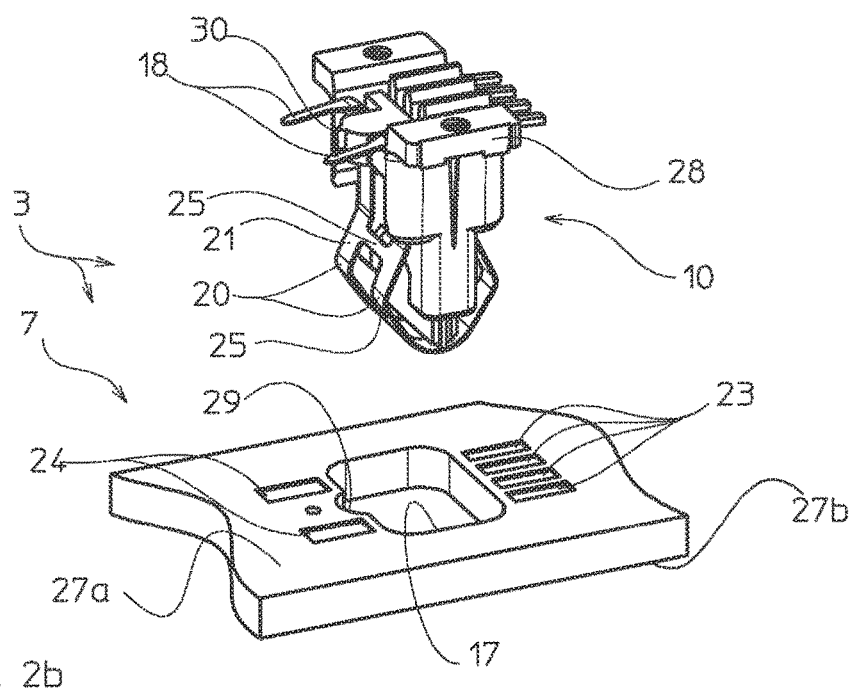
FIG. 2b is a view of the device of FIG. 2a where a magnetic field detector, housing and grounding device is disassembled from the circuit board.
Figure 3A:
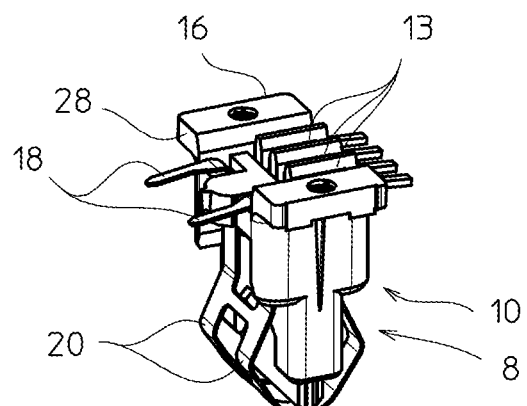
FIG. 3a is a view in perspective of the magnetic field detector, housing and grounding device of FIG. 2b.
Figure 3B:
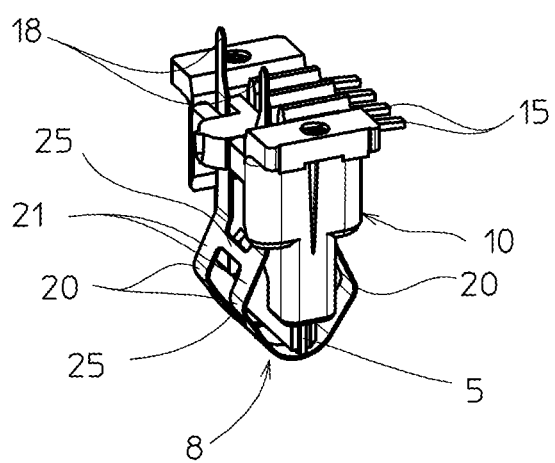
FIG. 3b is a view of the device of FIG. 3a where the grounding device terminals are shown inserted in the housing, prior to being bent.
Figure 4A:
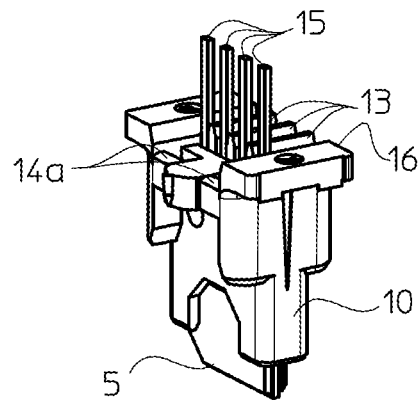
FIG. 4a is a view in perspective of the magnetic field detector and housing of FIG. 3b before assembly of the grounding device.
Figure 4B:
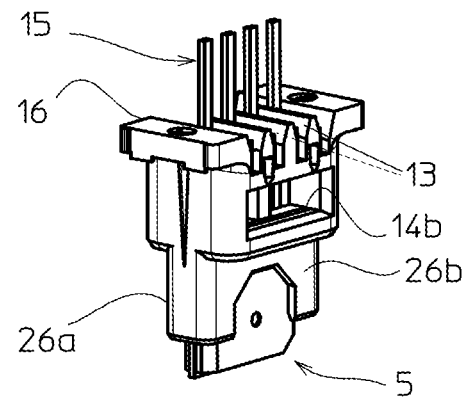
FIG. 4b is a view of the device of FIG. 4a seen from another angle.
Figure 4C:
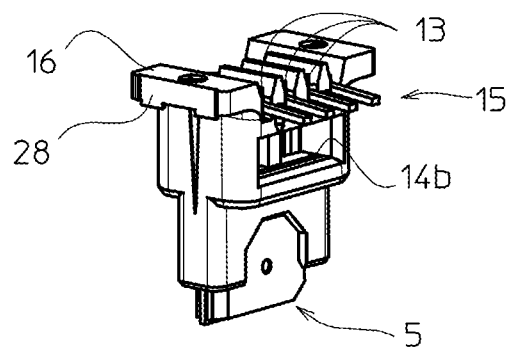
FIG. 4c is a view of the device of FIG. 4a where the magnetic field detector terminals are shown bent for surface mount connection.

Referring to the figures, an electrical current transducer 1 comprises a magnetic circuit 2, and a magnetic field sensing device 3. The magnetic circuit 2 comprises an annular magnetic core 4 with a gap 6 (also commonly known as an "air-gap" even though it may not be filled with air). The gap 6 is formed between opposed end faces 12 of the magnetic core 4. The magnetic core 4 is made of a material with a high magnetic permeability, which are per se well known, for instance such materials include FeSi or FeNi alloys. A central passage 9 of the magnetic core is configured for receiving one or more primary conductors carrying the electrical current or currents to be measured therethrough.

In the embodiment illustrated, the magnetic field sensing device 3 comprises a magnetic field detector 5, a circuit board 7, a housing 10 and a grounding device 8. In a variant (not shown), the magnetic field sensing device may be configured without the circuit board and comprise a connector for connection to an external circuit (not shown).

The magnetic field detector may be a Hall sensor in the form of an application specific integrated circuit (ASIC) with sensor contact terminals 15 configured for connection to conductive tracks 23 of the circuit board 7, or alternatively for connection to terminals of an external connector (not shown). Such Hall effect sensors are well known per se. Other types of magnetic field detectors, for instant fluxgate type sensors or giant magneto-resistive sensor may also be implemented in the present invention.

The housing 10 comprises a sensor receiving cavity 11 in which the magnetic field detector 5 is inserted and lodged. The magnetic field detector terminals 15 are positioned in sensor terminal guide slots 13 formed in a mounting base 16 of the housing. In the embodiment illustrated, the terminals 15 are configured for surface mount connection to contact pads 23 on a face of the circuit board 7, the terminals being bent orthogonally at a position proximate the magnetic field detector ASIC after insertion of the magnetic field detector the housing cavity 11. In a variant, the terminals 15 of the magnetic field detector may also be configured as pin terminals inserted into conductive holes of the circuit board or as terminals for connection to a complementary external connector (not shown). In the embodiment shown, the mounting base 16 of the housing 10 advantageously comprises a flange 28 configured to enable the housing to be inserted through an orifice 17 in the circuit board, or other form of board or support, and to rest by way of the flange 28 against a connection face 27a of the circuit board on an opposite side from a face 27b of the circuit board facing the magnetic core 4. A polarising element 30 of the housing complementary to a polarising element 29 or shape of the circuit board orifice may be provided to ensure correct orientation of the housing 10 inserted through the orifice 17.

The housing also serves to support the grounding device 8 and to enable electrical connection of the grounding device to an external grounding connection, for instance in the illustrated embodiment, to grounding pads 24 on the circuit board 7. In this regard the housing comprises grounding terminal guide slots 14a and a grounding free end guide slot 14b disposed on outer side faces 26a, 26b of the housing 10.

The grounding device is made of a non-magnetic material. The grounding device 8 comprises at least partially an electrically conductive material and serves to provide an electrical grounding connection between the magnetic core 4 and a ground connection to an electrical ground terminal, provided on the circuit board or a connector device, for example.

The ground device 8 may advantageously comprise a generally u shaped band or strip of conductive material that may in particular be made of stamped and formed sheet metal. The grounded device 8 comprises one or more terminals 18 for connection to one or more conductive grounding pads or conductive tracks 24 of circuit board 7 or for connection to a grounding wire or grounding terminals of an external connector (not shown). In an advantageous embodiment the terminals 18 are in the form of surface mount pins or tables for surface mount connection to the conductive pads 24 as shown in the illustrated embodiment. In a variant (not shown) the terminals may be provided in the form of pins for insertion in conductive through-holes of the circuit board. In the latter variant, the housing 10 is mounted on the face 27b of the circuit board facing the magnetic core 4, whereby the orifice 17 in the circuit board may be omitted. The illustrated embodiment however is particularly advantageous as it provides a robust, stable and compact mounting of the magnetic field sensor to the circuit board, reducing the cantilever distance between the grounding contact with the magnetic circuit and the circuit board 7.

The grounding device comprises elastically supported contacts 20 configured for insertion in the gap 6 of the magnetic core 4 and for spring bias against the end faces 12 of the core forming the gap. The contacts 20 are provided on opposed sides for electrical contact with respective opposed end faces 12 of the core. In a variant, it is however possible to provide an elastically supported contact 20 on only one side, for biasing against only one of the end faces 12, the other side for instance forming a rest surface biased against the opposite end face but not elastically supported. In the illustrated embodiment, the contacts 20 are formed as outwardly bent portions integrally formed with the strip of conductive material comprising one or more terminals 18, the strip bending in a general U-shape around the end of the magnetic field sensor and having portions mounted against the outer sides faces 26a, 26b of the housing. A free end 22 of the grounding element is received in a guide channel or slot 14b on one side face 26b and the terminals 18 are received in guide channels or slots 14a on the other side face 26a of the housing. In the embodiment illustrated, the grounding device 8 comprises orifices such that the contacts 20 are formed on spaced-apart branches 21 connected by bridging portions 25. This provides some independent elasticity of the contact portions 20 for better electrical contact with the magnetic core, and also limits any magnetic shielding effects due to Eddy currents generated in the grounding element. The conductive material of the grounding device is non-magnetic, in other words has a magnetic permeability close to that of air.

In a variant (not shown) the grounding device may be formed in materials other than sheet metal, for instance may be formed from a wire with elastic properties or may comprise an electrical contact mounted on a separately manufacture spring held and guided by the housing or integrally molded with the housing. In yet other variants (not shown) the contacts may be formed as a conductive coating or plating on a dielectric support provided with elastic properties. For instance, elastic arms integrally molded with the housing and projecting from the outer side walls may be plated with a conductive material that extends to the mounting flange 28 for solder connection to the grounding pads on the circuit board.

Advantageously, the invention enables the grounding connection of the magnetic core to be performed benefitting from insertion of the magnetic field sensor in the air gap of the magnetic core without welding, soldering or crimping. Also, the grounding device is assembled to or part of the magnetic field sensing device forming a compact and cost effective configuration that may be easily assembled to the magnetic core.

A plurality of magnetic field sensing devices with grounding devices may be mounted to a common circuit board for assembly to a plurality of magnetic cores. This may be useful for instance in a multi-phase current sensing device.

The magnetic field sensor arrangement of the present invention may be inserted in gaps of magnetic cores having various shapes and sizes for various applications, it being understood that the magnetic core may not form a circuit around a central channel, or may comprise a plurality of airgaps.

The magnetic field sensor arrangement according to the invention may also be implemented in systems in which a magnetic field is to be measured other than for electrical current measurement.

The invention claimed is:

1. A magnetic field sensor arrangement comprising:
a magnetic field detector for positioning in a gap formed between end faces of a magnetic circuit core;
a housing;
a grounding device; and
a circuit board on which the magnetic field detector, the housing and the ground device are mounted;
wherein the magnetic field detector and the grounding device are mounted to the housing,
wherein the grounding device comprises at least one contact elastically supported and configured for electrical contact with the magnetic circuit core,
wherein the elastically supported contact is mounted adjacent a sensing portion of the magnetic field detector and configured for insertion in the magnetic circuit core gap such that the contact elastically biases against said end face of the magnetic circuit core,
wherein the circuit board comprises an orifice and the housing comprises a mounting base comprising a flange,
wherein the orifice, the mounting base and the flange are configured to enable the housing to be inserted through the orifice in the circuit board and to rest by way of the flange against a connection face of the circuit board on an opposite side from face of the circuit board facing the magnetic circuit core.

2. The magnetic field sensor arrangement according to claim 1, wherein the magnetic field detector comprises terminals positioned in sensor terminal guide slots formed in a mounting base of the housing, the terminals being configured for surface mount connection to contact pads on the connection face of the circuit board.

3. The magnetic field sensor arrangement according to claim 1, wherein the housing comprises a sensor receiving cavity in which the magnetic field detector is inserted and lodged.

4. The magnetic field sensor arrangement according to claim 3, wherein the housing comprises a grounding terminal guide slot and a grounding free end guide slot disposed on respective outer side faces of the housing configured for holding or positioning the grounding device to the housing.

5. The magnetic field sensor arrangement according to claim 4, wherein the grounding device comprises a generally U-shaped band or strip of conductive material positioned around the magnetic field detector.

6. The magnetic field sensor arrangement according to claim 5, wherein the conductive material of the grounding device is non-magnetic.

7. The magnetic field sensor arrangement according to claim 6, wherein the grounding device is a single integral part stamped and formed from sheet metal.

8. The magnetic field sensor arrangement according to claim 4, wherein the contact are provided on opposed sides of the housing for electrical contact with respective opposed end faces of the magnetic circuit core.

9. The magnetic field sensor arrangement according to claim 1, wherein the contact are formed as outwardly bent portions integrally formed with a strip of conductive material comprising one or more terminals, the strip bending in a general U-shape around the end of the magnetic field detector and having portions mounted against the outer sides faces of the housing.

10. The magnetic field sensor arrangement according to claim 9, wherein the a free end of the grounding element is received in a guide channel or slot on one side face and the terminals are received in guide channels or slots on the other side face of the housing.

11. The magnetic field sensor arrangement according to claim 1, wherein the grounding device comprises orifices such that the contacts are formed on spaced-apart branches connected by bridging portions.

12. An electrical current transducer comprising:
a magnetic core; and
a magnetic field sensor arrangement comprising:
a magnetic field detector positioned in a gap formed between end faces of the magnetic core;

a housing;

a grounding device; and a circuit board on which the magnetic field detector, the housing and the grounding device are mounted, wherein the magnetic field detector and the grounding device are mounted to the housing, wherein the grounding device comprises at least one contact elastically supported and mounted adjacent a sensing portion of the magnetic field detector and inserted in the magnetic core gap such that the contact elastically biases against said end face of the magnetic core, wherein the circuit board comprises an orifice and the housing comprises a mounting base comprising a flange, wherein the orifice, the mounting base and the flange are configured to enable the housing to be inserted through the orifice in the circuit board and to rest by way of the flange against a connection face of the circuit board on an opposite side from a face of the circuit board facing the magnetic core.

13. The electrical current transducer according to claim 12, wherein the magnetic core forms a circuit surrounding a central cavity for receiving a primary conductor carrying a current to be measured therethrough.

14. The electrical current transducer according to claim 12, wherein the magnetic field detector comprises terminals positioned in sensor terminal guide slots formed in a mounting base of the housing, the terminals being configured for surface mount connection to contact pads on the connection face of the circuit board.

15. The electrical current transducer according to claim 12, wherein the housing comprises a sensor receiving cavity in which the magnetic field detector is inserted and lodged.

16. The electrical current transducer according to claim 15, wherein the housing comprises a grounding terminal guide slot and a grounding free end guide slot disposed on respective outer side faces of the housing configured for holding or positioning the grounding device to the housing.

17. The electrical current transducer according to claim 16, wherein the grounding device comprises a generally U-shaped band or strip of conductive material positioned around the magnetic field detector.

18. The electrical current transducer according to claim 17, wherein the conductive material of the grounding device is non-magnetic.

19. The electrical current transducer according to claim 18, wherein the grounding device is a single integral part stamped and formed from sheet metal.

20. The electrical current transducer according to claim 16, wherein the contacts are provided on opposed sides of the housing for electrical contact with respective opposed end faces of the magnetic core.

21. The electrical current transducer according to claim 12, wherein the contact are formed as outwardly bent portions integrally formed with a strip of conductive material comprising one or more terminals, the strip bending in a general U-shape around the end of the magnetic field detector and having portions mounted against the outer sides faces of the housing.

22. The electrical current transducer according to claim 5, wherein the a free end of the grounding element is received in a guide channel or slot on one side face and the terminals are received in guide channels or slots on the other side face of the housing.

23. The electrical current transducer according to claim 12, wherein the grounding device comprises orifices such that the contacts are formed on spaced-apart branches connected by bridging portions.

* * * * *